(12) United States Patent
Qi et al.

(10) Patent No.: US 10,283,278 B2
(45) Date of Patent: May 7, 2019

(54) GAS-INDUCED PEROVSKITE FORMATION

(71) Applicant: OKINAWA INSTITUTE OF SCIENCE AND TECHNOLOGY SCHOOL CORPORATION, Kunigami-gun, Okinawa (JP)

(72) Inventors: Yabing Qi, Kunigami-gun (JP); Sonia Ruiz Raga, Kunigami-gun (JP)

(73) Assignee: OKINAWA INSTITUTE OF SCIENCE AND TECHNOLOGY SCHOOL CORPORATION, Kunigami-Gun, Okinawa (JP)

( * ) Notice: Subject to any disclaimer, the term of this patent is extended or adjusted under 35 U.S.C. 154(b) by 0 days.

(21) Appl. No.: 15/574,006

(22) PCT Filed: May 16, 2016

(86) PCT No.: PCT/JP2016/002397
§ 371 (c)(1),
(2) Date: Nov. 14, 2017

(87) PCT Pub. No.: WO2016/194317
PCT Pub. Date: Dec. 8, 2016

(65) Prior Publication Data
US 2018/0294106 A1   Oct. 11, 2018

Related U.S. Application Data

(60) Provisional application No. 62/168,046, filed on May 29, 2015.

(51) Int. Cl.
*H01G 9/20* (2006.01)
*H01L 51/00* (2006.01)
(Continued)

(52) U.S. Cl.
CPC .......... *H01G 9/2009* (2013.01); *H01G 9/0036* (2013.01); *H01L 51/005* (2013.01);
(Continued)

(58) Field of Classification Search
CPC ................ H01G 9/2009; H01G 9/0036; H01L 51/0028; H01L 51/0077; H01L 51/0007; H01L 51/4253
See application file for complete search history.

(56) References Cited

U.S. PATENT DOCUMENTS

2015/0122314 A1   5/2015 Snaith et al.

FOREIGN PATENT DOCUMENTS

JP   2001-077085 A   *   3/2001   ......... H01L 21/3065
WO   2015/116297 A2       8/2015

OTHER PUBLICATIONS

Extended (supplementary) European Search Report dated May 3, 2018, issued in counterpart European Application No. 16802760.5. (8 pages).
(Continued)

*Primary Examiner* — William Coleman
(74) *Attorney, Agent, or Firm* — Westerman, Hattori, Daniels & Adrian, LLP (57) ABSTRACT

A method of forming a perovskite film is provided, the method comprising inducing a chemical reaction between a metal halide compound and methylamine ($CH_3NH_2$) gas. Specifically, the method includes: forming a metal halide film on a substrate; and exposing the metal halide film to the methylamine ($CH_3NH_2$) gas for inducing the chemical reaction between the metal halide compound and the methylamine ($CH_3NH_2$) gas to form a perovskite film. Post treatments can be carried out by adding a step of exposing the perovskite film to hydriodic acid (HI) gas and methylamine ($CH_3NH_2$) gas sequentially or simultaneously.

15 Claims, 8 Drawing Sheets

(51) Int. Cl.
H01L 51/42 (2006.01)
H01G 9/00 (2006.01)

(52) U.S. Cl.
CPC ...... *H01L 51/0007* (2013.01); *H01L 51/0008* (2013.01); *H01L 51/0028* (2013.01); *H01L 51/0077* (2013.01); *H01L 51/4226* (2013.01); *H01L 51/4253* (2013.01); *Y02E 10/549* (2013.01); *Y02P 70/521* (2015.11)

(56) References Cited

OTHER PUBLICATIONS

Eperon et al., "Formamidinium lead trihalide: a broadly tunable perovskite for efficient planar heterojunction solar cells", Energy Environ. Sci., 2014, vol. 7, pp. 982-988, (7 pages).

Burschka et al., "Sequential deposition as a route to high-performance perovskite-sensitized solar cells", Nature, Jul. 18, 2013, vol. 499, pp. 316-320, (5 pages).

Hao et al., "Controllable Perovskite Crystallization at a Gas-Solid Interface for Hole Conductor-free Solar Cells with Steady Power Conversion Efficiency over 10%", Journal of the American Chemical Society, Nov. 6, 2014, vol. 136, pp. 16411-16419, (9 pages).

Chen et al., "Planar Heterojunction Perovskite Solar Cells via Vapor-Assisted Solution Process", Journal of the American Chemical Society, Dec. 20, 2013, vol. 136, pp. 622-625, (4 pages).

International Search Report and Written Opinion dated Jul. 26, 2016, issued in counterpart International Application No. PCT/JP2016/02397 (8 pages).

* cited by examiner

(a) PbI₂ Film  (b) After MA Gas Exposure

[Fig. 4]

(a) PbI₂ Film | (b) Sample 1 (After MA Gas Exposure)

[Fig. 5]

(a) Sample 3 (After 2 Cycles of Subsequent HI and MA Exposures)

(b) Sample 4 (After Simultaneous HI and MA exposure)

GAS-INDUCED PEROVSKITE FORMATION

TECHNICAL FIELD

The present invention relates to method of forming organometal halide perovskite films based on a gas-induced reaction between source materials.

BACKGROUND ART

A solar cell (also called a photovoltaic cell) is an electrical device that converts solar energy into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are urrently reported to be around 14-22%.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, $CH_3NH_3PbX_3$ and $CH_3NH_3SnX_3$, where $X=Cl$, Br, I or a combination thereof, for example, have recently emerged as a promising material for the next generation of high efficiency, low cost solar technology. It has been reported that these synthetic perovskites can exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, chemical vapor deposition, etc.

Recent reports have indicated that this class of materials, i.e., organometal halide perovskites, have potential for high-performance semiconducting media in other optoelectronic devices as well. In particular, some perovskites are known to exhibit strong photoluminescence properties, making them attractive candidates for use in light-emitting diodes (LEDs). Additionally, it has been reported that perovskites also exhibit coherent light emission properties, hence optical amplification properties, suitable for use in electrically driven lasers. In these devices, electron and hole carriers are injected into the photoluminescence media, whereas carrier extraction is needed in solar cell devices.

In a typical solution processing, two solid powder precursors, methylammonium halide and metal halide, for example, are dissolved into solution and spin-coated on a substrate. A subsequent post-annealing step is required for a complete conversion of the spin-coated material to a perovskite film. Solution processing techniques, especially the related spin-coating techniques, are difficult to scale up, thereby being unsuitable for mass-production of large-area solar cells. The industrial-scale manufacturing of perovskite solar cells urgently calls for a new method that is suitable for obtaining a high-quality perovskite film over a large area at low cost.

CITATION LIST

Patent Literature

PL1: Snaith et al., US 2015/0122314A1.

Non Patent Literature

NPL1: G. E. Eperon et al., Formamidinium lead trihalide: a broadly tunable perovskite for efficient planar heterojunction solar cells. Energy Environ. Sci. 7, 982-988 (2014).

NPL2: J. Burschka et al., Sequential deposition as a route to high-performance perovskite-sensitized solar cells. Nature Vol. 499, 316-320 (July, 2013).

SUMMARY

A method of forming a perovskite film is provided, the method comprising inducing a chemical reaction between a metal halide compound and methylamine ($CH_3NH_2$) gas. Specifically, the method includes: forming a metal halide film on a substrate; and exposing the metal halide film to the methylamine ($CH_3NH_2$) gas for inducing the chemical reaction between the metal halide compound and the methylamine ($CH_3NH_2$) gas to form a perovskite film. Post treatments can be carried out by adding a step of exposing the perovskite film to hydriodic acid (HI) gas and methylamine ($CH_3NH_2$) gas sequentially or simultaneously.

DESCRIPTION OF EMBODIMENTS

Source materials in conventional methods for fabricating an organometal halide perovskite film include halide materials such as $PbCl_2$, $PbBr_2$, $PbI_2$, $SnCl_2$, $SnBr_2$, $SnI_2$ and the like, and methylammonium ($MA=CH_3NH_3^+$) compounds such as $CH_3NH_3Cl$, $CH_3NH_3Br$, $CH_3NH_3I$, and the like. In place of, or in a combination with the MA compound, a formamidinium ($FA=HC(NH_2)_2^+$) compound can also be used. Organometal halide perovskites have the orthorhombic structure generally expressed as $ABX_3$, in which an organic element, MA, FA or other suitable organic element, occupies each site A; a metal element, $Pb^{2+}$ or $Sn^{2+}$, occupies each site B; and a halogen element, Cl⁻, I⁻ or Br⁻, occupies each site X. (See, for example, Eperon et al., NPL1.) Source materials are denoted as AX and $BX_2$, where AX represents an organic halide compound having an organic element MA, FA or other suitable organic element for the A-cation combined with a halogen element Cl, I or Br for the X-anion; $BX_2$ represents a metal halide compound having a metal element Pb or Sn for the B-cation combined with a halogen element Cl, I or Br for the X-anion. Here, the actual element X in the AX and the actual element X in the $BX_2$ can be the same or different, as long as each is selected from the halogen group. For example, X in the AX can be Cl, while X in the $BX_2$ can be Cl, I or Br. Accordingly, formation of a mixed perovskite, e.g., $MAPbI_{3-x}Cl_x$, is possible. The terms "perovskite" and "organometal halide perovskite" are used interchangeably and synonymously in this document.

Organometal halide perovskite can be used for an active layer in an optoelectronic device, such as a solar cell, LED, laser, etc. Here, the "active layer" refers to an absorption layer where the conversion of photons to charge carriers (electrons and holes) occurs in a photovoltaic device; for a photo-luminescent device, it refers to a layer where charge carriers are combined to generate photons.

A $CH_3NH_3PbI_3$ perovskite film, for example, is formed conventionally by using a solution method based on the chemical reaction between two source materials, methylammonium iodide ($CH_3NH_3I$) and lead iodide ($PbI_2$). Prior to the perovskite formation, the $CH_3NH_3I$ source material is prepared, for example, by mixing methylamine ($CH_3NH_2$) solution and hydriodic acid (HI) with a proper molar ratio and atmosphere to promote the chemical reaction. Thus, a conventional solution method involves the following two steps:

$$CH_3NH_2 + HI \rightarrow CH_3NH_3I, \quad \text{Eq. (1)}$$

$$PbI_2 + CH_3NH_3I \rightarrow CH_3NH_3PbI_3. \quad \text{Eq. (2)}$$

This document describes a new method of forming a perovskite film, wherein the formation is induced by a chemical reaction between a metal halide compound and methylamine ($CH_3NH_2$) gas, instead of using the typically employed methylammonium iodide ($CH_3NH_3I$). Thus, the step of forming $CH_3NH_3I$ by mixing $CH_3NH_2$ and HI, as represented by Eq. (1) above, is skipped in the present method. Methylamine ($CH_3NH_2$) gas is referred to as MA gas herein. The case of forming a $CH_3NH_3PbI_3$ perovskite film from $CH_3NH_2$ gas and $PbI_2$ is described in detail below. It should be noted, however, that the method can be extended for use of other metal halides, such as $PbCl_2$, $PbBr_2$, $SnCl_2$, $SnBr_2$, $SnI_2$ and a combination thereof. Examples of resultant perovskite materials include but not limited to: $CH_3NH_3PbCl_3$, $CH_3NH_3PbBr_3$, $CH_3NH_3PbI_3$, $CH_3NH_3SnBr_3$, $CH_3NH_3PbBr_xI_{3-x}$, and $CH_3NH_3PbBr_xCl_{3-x}$. According to the present method, the perovskite film formation is achieved by using methylamine ($CH_3NH_2$) molecules in gas phase; as such, the present method is termed "MAGIC" which stands for MethylAmine Gas Induced ReaCtion.

Figure 1:
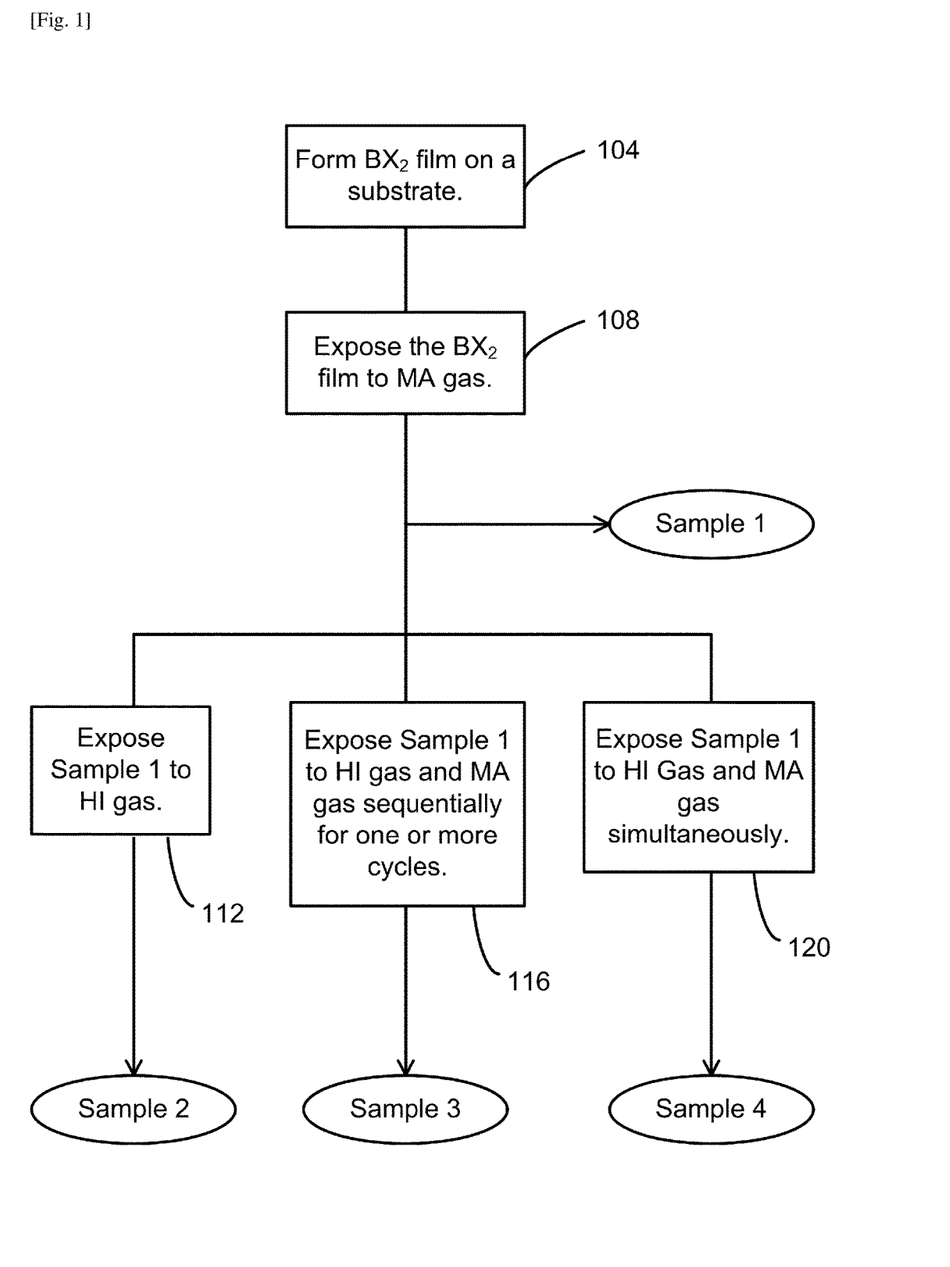
FIG. 1 is a flowchart illustrating the present process for gas-induced fabrication of a perovskite film.

FIG. 1 is a flowchart illustrating the present process for gas-induced fabrication of a perovskite film. Although specific values are cited herein to explain various steps, experiments and analyses as examples, it should be understood that these are approximate values and/or within measurement tolerances. As mentioned earlier, the case of forming a $CH_3NH_3PbI_3$ perovskite film from $CH_3NH_2$ gas and $PbI_2$ is described in detail below as a specific example. It should be noted, however, that the method can be extended for use of other metal halides, such as $PbCl_2$, $PbBr_2$, $PbI_2$, $SnCl_2$, $SnBr_2$, and $SnI_2$, denoted as $BX_2$ in FIG. 1. First in step 104, a $PbI_2$ film as the $BX_2$ film is formed on a substrate. The substrate can be fluorine-doped tin oxide (FTO), glass, $TiO_2$, or fabricated to have a sequence of layers made of glass or FTO/compact layer $TiO_2$/mesoporous $TiO_2$, for example. In a specific example process to form a $PbI_2$ film, $PbI_2$ powder is dissolved in dimethylformamide (DMF, 460 mg mL⁻¹), and stirring is continued at 70° C. until it is completely dissolved. Then, the $PbI_2$ solution is spincoated on the substrate, heated at 70° C., at 4000 rpm for 30 seconds. The substrate with the spin-coated $PbI_2$ is then dried on a hot plate at 70° C. for 5 minutes in a $N_2$ glovebox. The substrate with the spin-coated $PbI_2$ is then taken out to the air. One or more substrates can be processed at the same time to obtain one or more $PbI_2$ films on the respective substrates. A solution method with spin coating is employed herein to form the $BX_2$ film on the substrate. However, it should be understood by one of ordinary skill in the art that any of other suitable fabrication methods, such as vacuum evaporation and chemical vapor deposition, can also be utilized to form a $BX_2$ film on a substrate.

Figure 2:
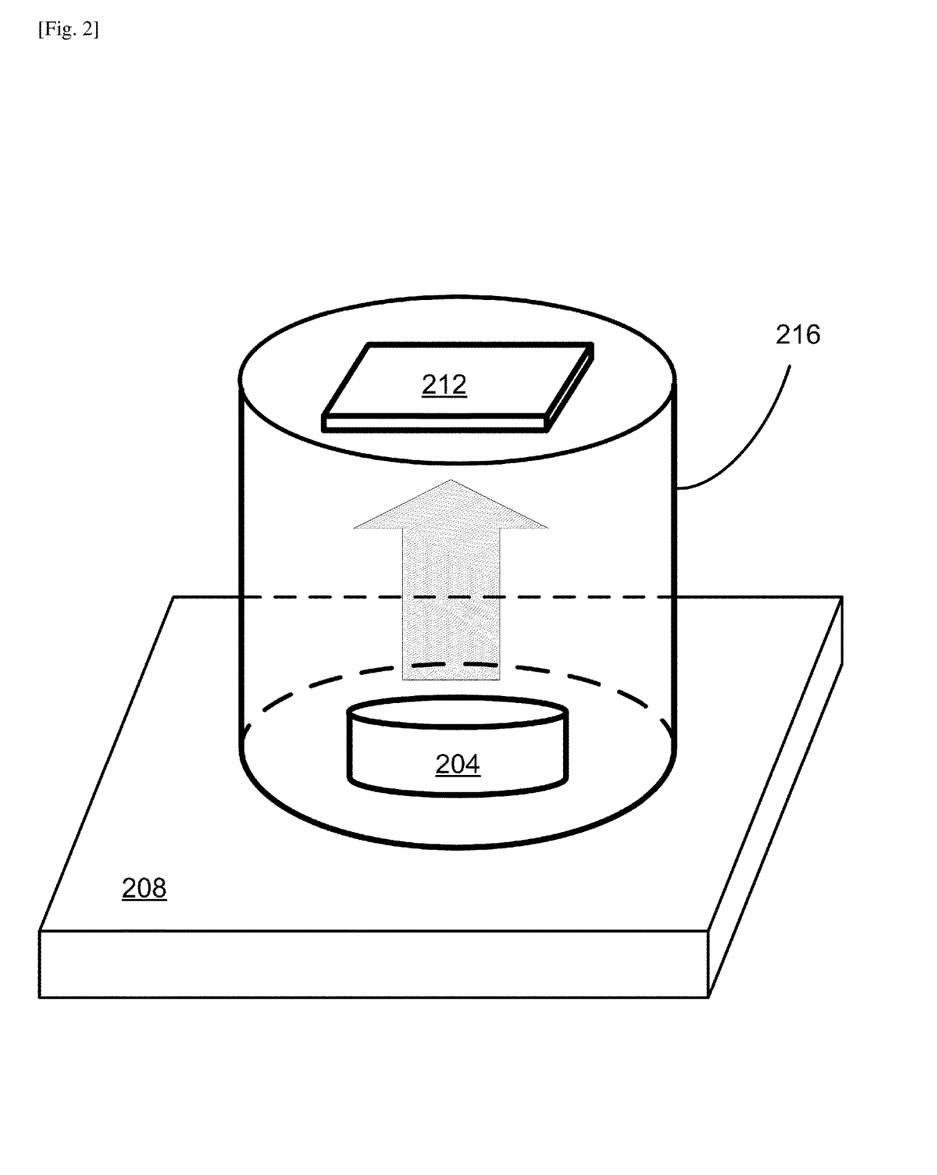
FIG. 2 illustrates a setup employed to carry out the MA gas, i.e., methylamine ($CH_3NH_2$) gas, exposure step.

In step 108, the $PbI_2$ film deposited on the substrate is exposed to MA gas. FIG. 2 illustrates a setup employed to carry out the MA gas exposure step 108. One or more substrates, each deposited with the $PbI_2$ film, can be processed in this step simultaneously, and the sizes of the substrates can be the same or different. In the following, the case of using one substrate pre-deposited with the $PbI_2$ film is explained for illustrative purposes. A container with an opening, such as a vial or a petri dish, can be used to contain a methylamine ($CH_3NH_2$) solution in a solvent. In a specific example, a petri dish 204 with an opening of 2 cm in diameter is filled with ~200 μL of MA solution in ethanol (33% wt.). The MA containing petri dish 204 is then placed on a hot plate 208, which is heated at 45° C. The substrate 212 with the pre-deposited $PbI_2$ film is attached on the internal bottom surface of an 8 cm tall beaker 216 by using a double sided tape. Then, the beaker 216 is placed upside down to cover the MA containing petri dish 204, in such a way that the substrate surface having the spincoated $PbI_2$ faces the opening of the petri dish 204 so as to get exposed to the MA gas from the petri dish 204. The MA gas from the heated solution in the petridish 204 is schematically depicted with a grey arrow in FIG. 2.

After 5 seconds of exposure to the MA gas, the color of the $PbI_2$ film starts changing to a brownish color, and after 5 seconds more exposure, the film turns semitransparent. After that point, once the beaker 216 with the substrate 212 with the pre-deposited $PbI_2$ film is removed, the color turns brown within 5 seconds. All the samples pass through these color changes happening within one minute. This ensures that the reaction reached the bulk of the film, attaining saturation conditions. The post annealing studies were performed after $PbI_2$ films are saturated with MA gas, and the substrates with the films are placed immediately on a second hot plate preheated at 45, 70 or 100° C., and left for two minutes.

Figure 3:
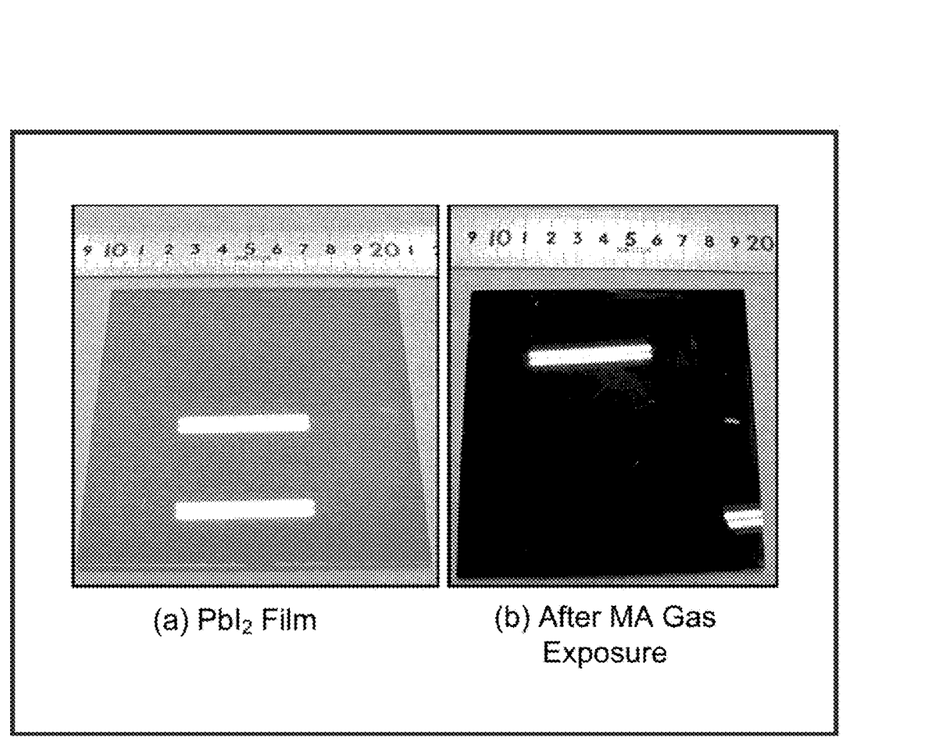
FIG. 3 shows photos of the $PbI_2$ film in (a) and the same film after the MA gas exposure step in (b), both formed on a 10×10 $cm^2$ FTO substrate.

Using a similar but larger setup, it is possible to form a high-quality mirror-like semitransparent perovskite film on a large substrate within one minute by carrying out the MA gas exposure step 108. FIG. 3 shows photos of the $PbI_2$ film in (a) and the same film after the MA gas exposure step 108 in (b), both formed on a 10×10 cm² FTO substrate. The $PbI_2$ film in (a) has the characteristic yellow color. Once the sample is removed from the MA gas exposure, the film becomes dark-red/brown in color within 5 seconds with a mirror-like surface as shown in (b), similar to $CH_3NH_3PbI_3$ perovskite films synthesized by a conventional solution method using $CH_3NH_3I$ and $PbI_2$ source materials.

Figure 4:
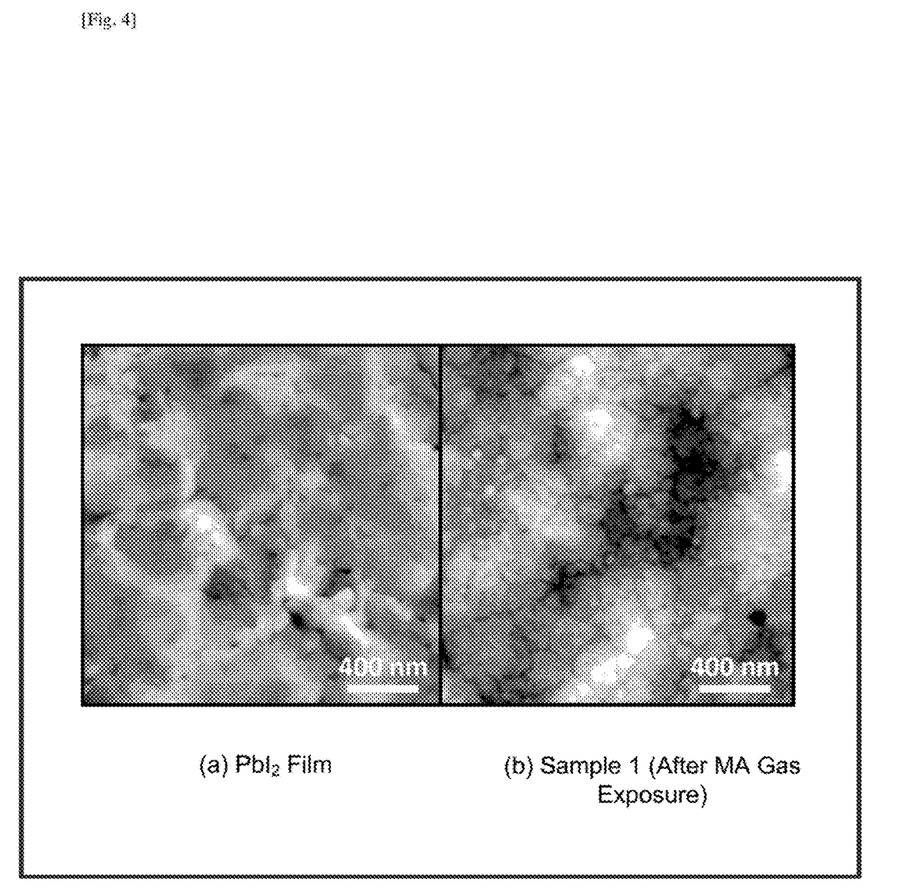
FIG. 4 shows tapping mode AFM images of the $PbI_2$ film in (a) and the same film in (b) subsequently treated with the MA gas exposure step, i.e., Sample 1.

Visual examinations on the samples obtained after the MA gas exposure step 108 revealed that all the samples are uniform and smooth with a mirror-like appearance. The films obtained after the MA gas exposure step 108 are hereinafter collectively called Sample 1. The smoothness was further confirmed by atomic force microscopy (AFM) measurements. FIG. 4 shows tapping mode AFM images of the $PbI_2$ film in (a) and the same film in (b) subsequently treated with the MA gas exposure step 108, i.e., Sample 1. Morphology examinations on the films showed that a root mean square (RMS) surface roughness is ~21 nm for the $PbI_2$ film, and the RMS surface roughness of Sample 1 is ~2 nm, which is ~10 times smoother than the initial $PbI_2$ film. This explains the mirror-like semi-transparent pinhole-free appearance of the film obtained after the MA gas exposure step 108. Despite the smoothness of the films, the grain sizes in Sample 1 were extremely small and in the range of 40-70 nm.

The above results and observations demonstrate the potential of the present method for a large-area solar cell mass production at low cost. Referring back to the setup depicted in FIG. 2, the containers 204 and 216 can be made of any mildly heat-resilient and acid-resistant material through which gas or molecules do not permeate, for example, glass. The horizontal cross-sectional areas of the containers 204 and 216 can be made large to accommodate a large size substrate 212 or multiple substrates 212, and correspondingly to produce a large flux of MA gas. Successful growth of a perovskite film on a 10×10 cm² substrate or larger is demonstrated, as exemplified in FIG. 3. Based on a simple and low-cost setup as above, fabrication of high-quality perovskite films can be achieved by using the present method wherein the chemical reaction between a metal halide compound and $CH_3NH_2$ (MA) gas is induced, instead of employing a conventional solution method using a metal halide compound and $CH_3NH_3I$ as source materials

As explained later based on X-ray diffraction (XRD) measurements, the major composition of the films in Sample 1 is indeed stoichiometric $CH_3NH_3PbI_3$ perovskite. However, additional lead oxide (PbO) and $Pb(OH)_2$ phases were also observed to form and distributed in the films according to X-ray photoelectron spectroscopy measurements (XPS). It is considered that the PbO and $Pb(OH)_2$ phases are formed as a byproduct based on the reaction expressed in Eq. (3) and the alternative reaction pathway expressed in Eqs. (4) and (5), respectively, as follows:

$$3PbI_2 + 2CH_3NH_2 + H_2O \rightarrow 2CH_3NH_3PbI_3 + PbO, \quad \text{Eq. (3)}$$

$$CH_3NH_2 + H_2O \rightarrow CH_3NH_3OH, \quad \text{Eq. (4)}$$

$$3PbI_2 + 2CH_3NH_3OH \rightarrow 2CH_3NH_3PbI_3 + Pb(OH)_2. \quad \text{Eq. (5)}$$

The fact that the MA gas exposure step 108 can proceed even at room temperature clearly suggests its spontaneity, i.e. the formation of stoichiometric perovskite and PbO and/or $Pb(OH)_2$ is thermodynamically more favorable than: (i) the reactants $PbI_2$, MA and $H_2O$ and (ii) the formation of non-stoichiometric perovskite containing a large number of iodine vacancies (i.e. $PbI_2+MA \rightarrow MAPbI_2$). Additionally, based on the observation that the $CH_3NH_3PbI_3$ perovskite can be formed by performing the MA gas exposure step 108 in ambient air, the presence of $H_2O$ is considered to play an important role to achieve the stoichiometric $CH_3NH_3PbI_3$ perovskite, as described in the reaction in Eq. (3). To confirm the importance of the $H_2O$ presence in the reaction, a control experiment of the MA gas exposure step 108 was performed in a dry environment such as in a $N_2$ glovebox with $H_2O$ levels below 0.1 ppm. No perovskite formation was observed in this control experiment. Only when the sample was transferred out from the glovebox to air (relative humidity of ~50%), the film immediately started turning brown in color. Prolonged air exposure led to the further darkening of the film color. The color darkening process when the sample was exposed to air reached saturation after 2 minutes.

Further studies based on XPS measurements were conducted. The XPS analysis confirmed the formation of lead oxide and $Pb(OH)_2$ phases in Sample 1, consistent with the two reaction pathways expressed in Eq. (3) and Eqs. (4) and (5), respectively. However, it was difficult to determine the crystal and electronic structures of these lead compounds. In general, Pb has several possible oxidation states, e.g., $Pb^{2+}$, $Pb^{8/3+}$, $Pb^{4+}$. In terms of oxides, there are PbO, $Pb_3O_4$, and $PbO_2$, respectively. According to the NIST data, these oxidation states show similar peak positions in XPS measurements (e.g., 137.80 for PbO, 137.65 for $PbO_2$, 137.90 for $Pb_3O_4$). With a typical energy resolution of 0.7 eV for the XPS instrument used for these measurements, it is difficult to differentiate these oxidation states. Furthermore, by taking into account the possibility that a mixture of these oxides can also be formed, the lead oxides formed in the present reaction can be expressed with the generalized notation $PbO_x$, where $1 \leq x \leq 2$. In addition, when these oxides are exposed to ambient with humidity, moisture can get incorporated, thereby leading to the formation of $PbO_x \cdot y(H_2O)$, where y=0, 1, 2, . . . . Accordingly, the lead compounds generated in the present reactions are hereinafter expressed as $PbO_{x+y}H_{2y}$, where $1 \leq x \leq 2$ and y=0, 1, 2, . . . . For example, x=1 and y=1 corresponds to $Pb(OH)_2$; and x=1 and y=0 corresponds to PbO.

To convert PbO and $Pb(OH)_2$ back to $PbI_2$, a process step of exposing the films to hydriodic acid (HI) gas can be added in the present fabrication method, based on the following reaction formulas:

$$PbO + 2HI \rightarrow PbI_2 + H_2O, \quad \text{Eq. (6)}$$

$$Pb(OH)_2 + 2HI \rightarrow PbI_2 + 2H_2O. \quad \text{Eq. (7)}$$

Referring back to FIG. 1, in step 108, the $PbI_2$ film is exposed to MA gas at room temperature, resulting in a film comprising perovskite and $PbO_{x+y}H_{2y}$ with characteristic grain sizes in the range of 40 nm-70 nm and a RMS surface roughness of ~2 nm, which is termed Sample 1 herein. In step 112, Sample 1 is subsequently exposed to HI gas, resulting in Sample 2. In an example setup, Sample 1 is placed on a hot plate heated at 70° C. and covered by a glass petri dish of 5 cm in diameter. The HI exposure is performed by placing a small crucible containing ~50 μL of HI solution inside the petri dish and in the proximity of a film of Sample 1. The HI gas fills the space inside the petri dish, reacting with Sample 1 and re-converting the $PbO_{x+y}H_{2y}$ to $PbI_2$, via the reactions expressed in Eq. (6) and (7). Various experiments suggest that the optimal HI exposure time is between 2-4 min.

Alternative to step 112, in step 116, Sample 1 is exposed sequentially to HI gas and MA gas, resulting in Sample 3. In an example setup, Sample 1 is placed on a hot plate heated at 70° C. and covered by a glass petri dish of 5 cm in diameter. The HI exposure is performed by placing a small crucible containing ~50 μL of HI solution inside the petri dish and in the proximity of a film of Sample 1; subsequently the MA exposure is performed by placing a small crucible containing ~200 μL of MA solution inside the petri dish and in the proximity of the film. This process converts $PbO_{x+y}H_{2y}$ to $PbI_2$ first, via the reactions expressed in Eqs. (6) and (7), and eventually to $CH_3NH_3PbI_3$, via the reaction expressed in Eq. (3), with grain sizes of ~400 nm and a RMS surface roughness of ~14 nm. Various experiments suggest that the optimal treatment is the HI exposure for 2 min and the MA exposure for 4 min, venting the remaining gas before changing the material. Two or more cycles of the sequential HI exposure and MA exposure can be repeated for Sample 1 to generate Sample 3. If the number is not specified, this process in step 116 refers to a single cycle of sequential HI exposure and MA exposure hereinafter. Contrary to Sample 1 (after the first MA gas exposure in step 108), the film of Sample 3, with the second and further MA gas exposure steps, does not turn transparent after 4 min.

Alternative to steps 112 and 116, in step 120, Sample 1 is exposed simultaneously to HI and MA gases, resulting in Sample 4. In an example setup, Sample 1 is placed on a hot plate heated at 70° C. and covered by a glass Petri dish of 5 cm in diameter, with a small gap of ~2 mm between the hot plate surface and Petri dish to let the air flow inside the Petri dish. For the simultaneous HI and MA gas exposure, small crucibles filled with ~100 μL of HI solution and ~400 μL of MA solution, respectively, are placed inside the Petri dish and in the proximity of Sample 1. In this reaction, a white-dense homogeneous smoke was formed and moved by the air flow under the Petri dish. The deposited powder was identified as methylammonium iodide (MAI) by XRD studies. The film is left for 10 min, and blown with $N_2$ gas. The resultant Sample 4 is a smooth perovskite film with grain sizes of ~200 nm and a RMS surface roughness of ~6 nm.

Figure 5:
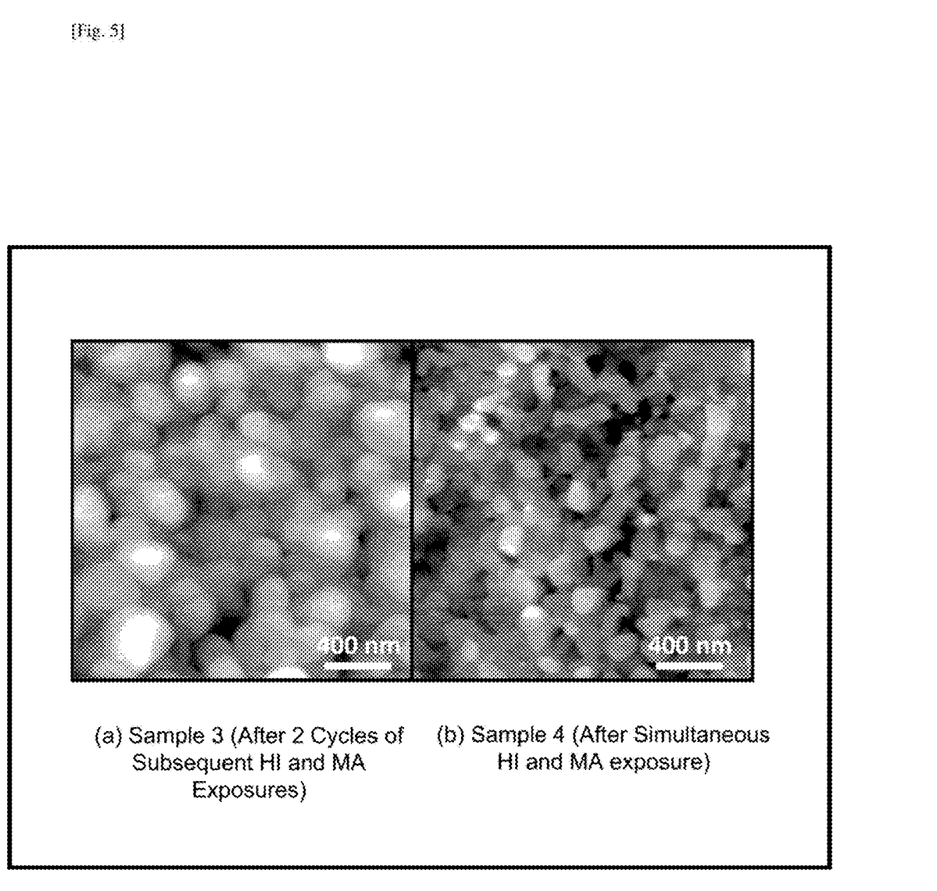
FIG. 5 shows tapping mode AFM images of Sample 3 in (a) and Sample 4 in (b.)

FIG. 5 shows tapping mode AFM images of Sample 3 in (a) and Sample 4 in (b). Sample 3 was obtained after 2 cycles of the subsequent HI gas and MA gas exposures on Sample 1 in step 116. Sample 4 was obtained after the simultaneous HI gas and MA gas exposure on Sample 1 in step 120. Morphology examinations on the samples showed that Sample 3 has grain sizes of ~400 nm and a RMS surface roughness of ~14 nm; and Sample 4 has grain sizes of ~200 nm and a RMS surface roughness of ~6 nm.

Figure 6:
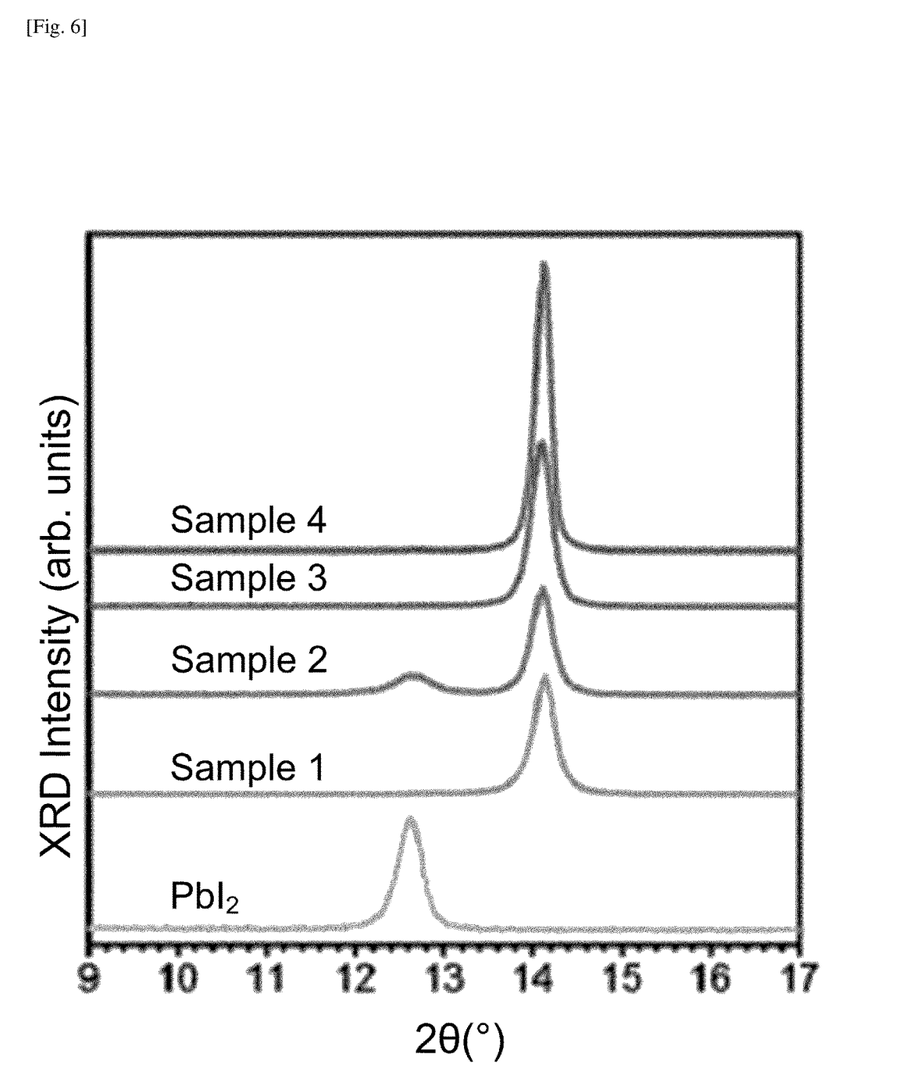
FIG. 6 shows plots of XRD intensities of $PbI_2$ film, Sample 1, Sample 2, Sample 3 and Sample 4.

FIG. 6 shows plots of XRD intensities of $PbI_2$ film, Sample 1, Sample 2, Sample 3 and Sample 4. Upon comparing the XRD peaks of the $PbI_2$ film and Sample 1, it is confirmed that the conversion of $PbI_2$ to the perovskite crystal has completed with no residual $PbI_2$ phase in the film after the MA gas exposure in step 108. The present XRD measurements show that the XRD peaks at 14.1° and 28.5° of Samples 1-4 match well with the (110) and (220) peaks, respectively, of $CH_3NH_3PbI_3$ perovskite films fabricated by the conventional method, i.e., a solution method with spin-coating using $PbI_2$ and $CH_3NH_3I$ source materials. The XRD results of Sample 2 show the formation of $PbI_2$ via the transformation of $PbO_{x+y}H_{2y}$ phases due to the HI gas exposure, following the reactions expressed in Eqs. (6) and (7), respectively. Alternatively, this may be caused by an iodination process due to the co-existence of $I_2$ gas in the HI fume. The XRD results of Samples 3 and 4 show that purer $CH_3NH_3PbI_3$ perovskite with no residual $PbI_2$ was formed after the sequential exposure to HI gas and MA gas in step 116, as well as after the simultaneous exposure to HI gas and MA gas in step 120.

Further studies based on XRD measurements were conducted, wherein films of Sample 1, which had been formed by carrying out the MA gas exposure step 108 at 24° C., followed by post-annealing at different temperatures of 45, 70, and 100° C., were compared to a reference sample that is the $CH_3NH_3PbI_3$ perovskite film synthesized by a conventional solution method with spin-coating using $CH_3NH_3I$ and $PbI_2$ source materials. The peak widths of (110) and (220) peaks of all the films in Sample 1, with or without the post-annealing treatment, were observed to be broader than the respective peak widths of the reference perovskite film. This is considered to be due to the small grain sizes obtained in Sample 1 in comparison with the reference perovskite film, consistent with the AFM results. Furthermore, the present XRD measurements indicated that Sample 1 does not generate appreciable number of defects therein, confirming that the major composition of the films obtained after the MA gas exposure step 108 is indeed stoichiometric $CH_3NH_3PbI_3$ perovskite. It is considered that because of the small size and high vapor pressure (e.g., 250 kPa at 25° C.) of MA gas molecules, they easily permeate into the $PbI_2$ film to achieve the stoichiometry.

Figure 7:
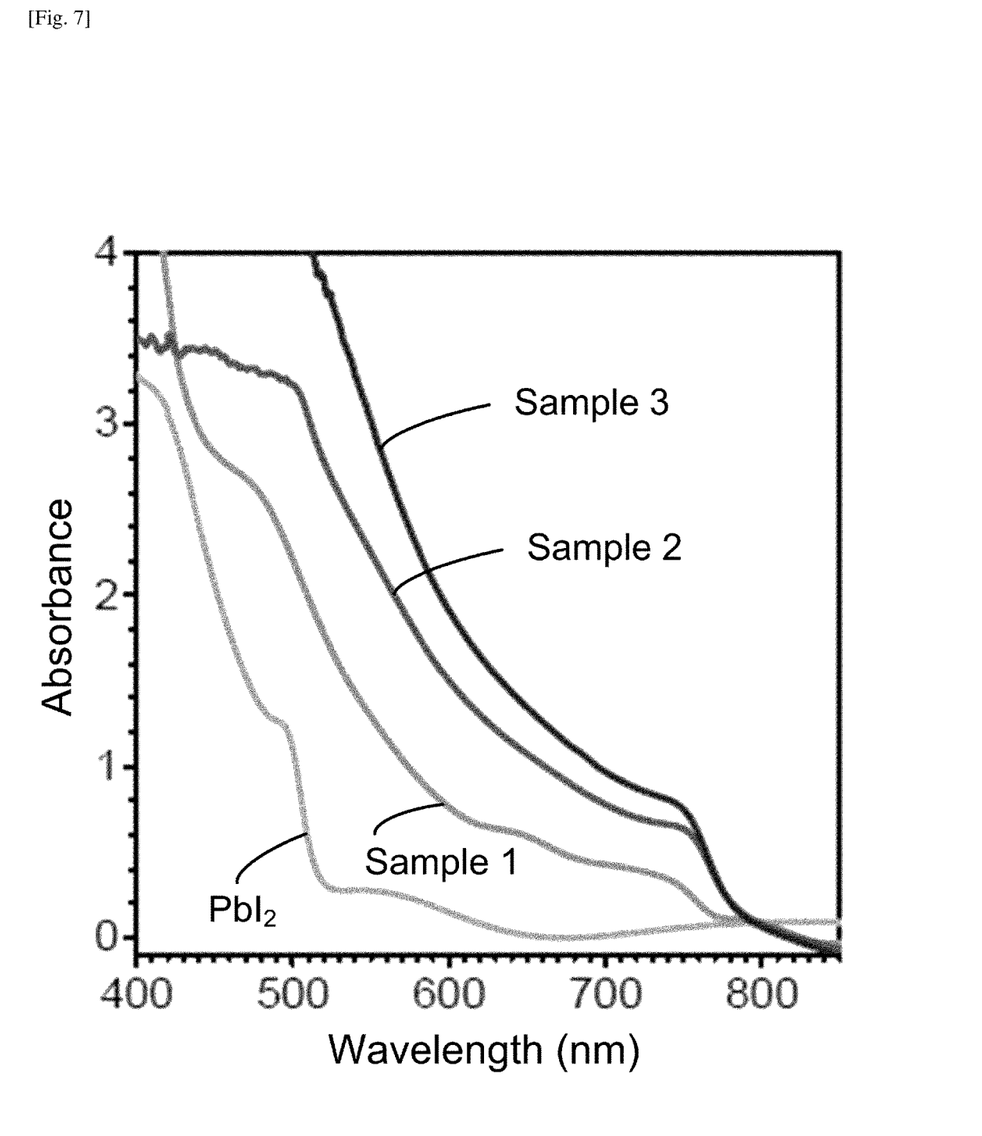
FIG. 7 shows plots of UV-visible absorption spectra of $PbI_2$ film, Sample 1, Sample 2 and Sample 3

FIG. 7 shows plots of UV-visible absorption spectra of $PbI_2$ film, Sample 1, Sample 2 and Sample 3. Each of the spectra of Samples 1-3 shows a sharp absorption edge at ~775 nm, corresponding to a bandgap of ~1.6 eV, in good agreement with the $CH_3NH_3 PbI_3$ perovskite fabricated by using the conventional method.

Solar cells were fabricated by using the perovskite films obtained in Samples 1-4. Each perovskite film is used as an absorber, i.e., an active layer, with subsequent stacked layers of 2,2',7,7'-tetrakis(N,N'-di-p-methoxyphenylamine)-9,9'-spirobifluorene (spiro-OMeTAD) and Au as a hole transport layer and an electrode, respectively. In a specific example, the hole transport layer was deposited by spin-coating, at 2000 rpm, using a chlorobenzene solution containing 59 μL of spiro-OMeTAD, 172 μL of tert-butylpyridine, and 32 μL of Li-bis(trifluoromethanesulfonyl)-imide salt pre-dissolved in acetonitrile. The top contact was fabricated by thermal evaporation of gold, with a final thickness of 80 nm. The devices were not sealed.

Figure 8:
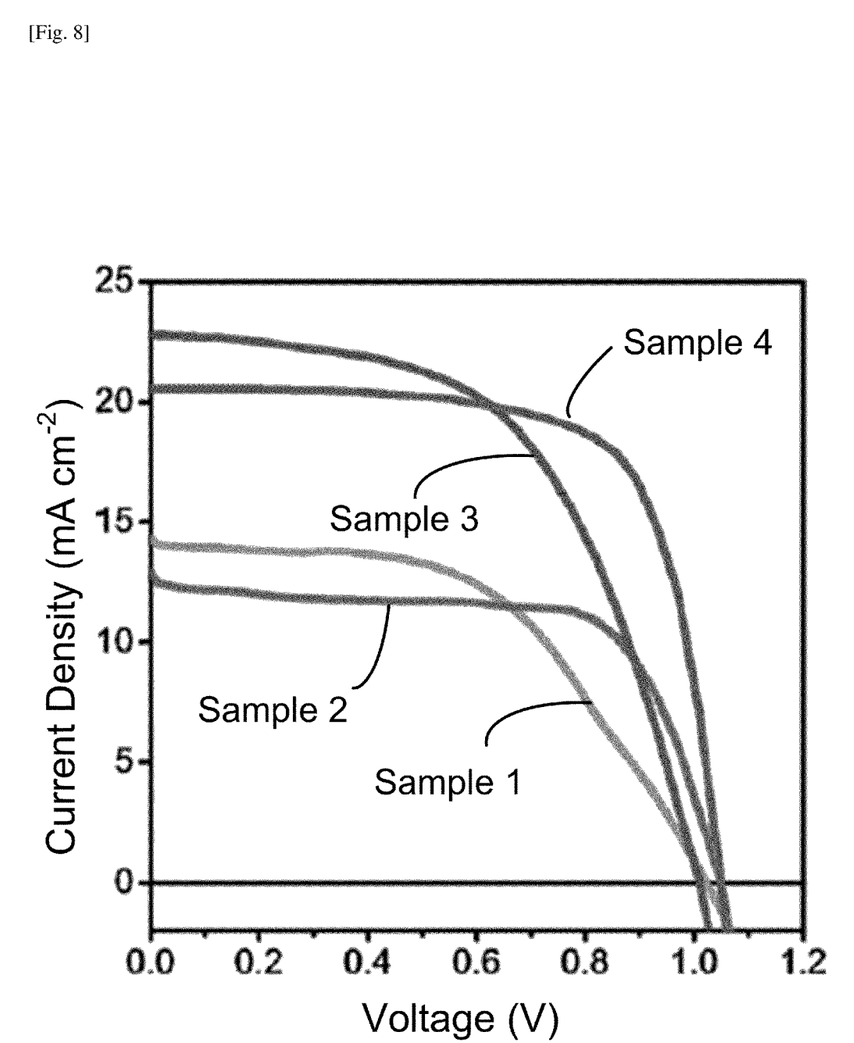
FIG. 8 shows plots of j-V curves of the solar cells fabricated by using the perovskite films of Samples 1-4.

FIG. 8 shows plots of j-V curves of the solar cells fabricated by using the perovskite films of Samples 1-4. The measurements were conducted under AM 1.5 (100 mWcm$^{-2}$) illumination conditions. Table 1 shows the power conversion efficiency (PCE), short-circuit current (jsc), open-circuit voltage (Voc), and fill factor (FF), for the solar cells fabricated by using the perovskite films of Samples 1-4. These values were calculated based on statistical analyses using at least 6 different cells. Solar cell parameters corresponding to the cell with the best performance in each batch are indicated in brackets. In this table, Sample 3 corresponds to the cells using the perovskite films after 3 cycles of the sequential HI gas and MA gas exposure in step 116.

TABLE 1

| Sample | Treatment | PCE (%) | jsc (mAcm$^{-2}$) | Voc (V) | FF |
| --- | --- | --- | --- | --- | --- |
| 1 | MA gas exposure on the PbI$_2$ film | 6.8 ± 0.7 [7.6] | 14.4 ± 1.3 [14.2] | 1.03 ± 0.01 [1.02] | 0.47 ± 0.04 [0.52] |

TABLE 1-continued

| Sample | Treatment | PCE (%) | jsc (mAcm$^{-2}$) | Voc (V) | FF |
|---|---|---|---|---|---|
| 2 | Subsequent HI gas exposure | 6.9 ± 1.2 [8.9] | 12.1 ± 0.7 [12.5] | 1.03 ± 0.03 [1.05] | 0.60 ± 0.09 [0.68] |
| 3 | Sequential HI gas and MA gas exposure | 9.4 ± 1.8 [12.7] | 19.1 ± 2.7 [22.8] | 1.01 + 0.02 [1.01] | 0.53 ± 0.03 [0.56] |
| 4 | Simultaneous HI gas and MA gas exposure | 13.5 ± 1.1 [15.3] | 19.0 ± 0.9 [20.6] | 1.04 ± 0.01 [1.05] | 0.69 ± 0.03 [0.71] |

Solar cells based on the Sample 1 films, which have gone through the MA gas exposure step 108, showed the PCE as high as 7.6% with Voc of 1.02 V, jsc of 14.2 mA cm$^{-2}$, and FF of 0.52. The large increase in FF of Sample 2 compared to Samples 1 is considered to be due to better charge transport properties of PbI$_2$, present in the Sample 2 films, than PbO$_{x+y}$H$_{2y}$, present in the Sample 1 films. The slight decrease in jsc (from 14.4 mA cm$^{-2}$ to 12.1 mA cm$^{-2}$) may be correlated with some parts of the perovskite being reconverted to PbI$_2$ in the HI gas exposure step 112, lowering the photocurrent generation. In contrast to the slight efficiency improvement by the HI gas exposure step 112, both the sequential HI gas and MA gas exposure step 116 and the simultaneous HI gas and MA gas exposure step 120 led to substantial improvement in solar cell performance, with the best cell achieving the PCE of 15.3% with Voc of 1.05 V, jsc of 20.6 mA cm$^{-2}$, and FF of 0.71. Stability profiles of all solar cells were good; for example, the solar cell device stored in a glovebox retained an efficiency of 14.6% after 3000 hours, with an integrated jsc of 17.0 mA cm$^2$ extracted from external quantum efficiency (EQE) and a steady current at a peak point of 16.5 mA cm$^{-2}$.

As mentioned earlier, the present method can be extended for use of other halide metals, such as PbCl$_2$, PbBr$_2$, SnCl$_2$, SnBr$_2$, SnI$_2$ and a combination thereof. Examples of resultant perovskite materials include but not limited to: CH$_3$NH$_3$PbCl$_3$, CH$_3$NH$_3$ PbBr$_3$, CH$_3$NH$_3$PbI$_3$, CH$_3$NH$_3$SnBr$_3$ CH$_3$NH$_3$PbBr$_x$I$_{3-x}$, and CH$_3$NH$_3$PbBr$_x$Cl$_{3-x}$. In specific examples, the MA gas exposure step 108 was performed to convert the PbBr$_2$ and PbCl$_2$ films into CH$_3$NH$_3$PbBr$_3$ and CH$_3$NH$_3$PbCl$_3$ perovskites, respectively. It was found that the time scale for CH$_3$NH$_2$ intercalation into the Pb halide was much slower for PbCl$_2$ (~180 s) than PbBr$_2$ (~60 s) and PbI$_2$ (~15 s), suggesting that the formation of iodine-based perovskite is more favorable than the Br and Cl counterparts. When the PbCl$_2$ film that has been treated with the MA gas exposure, i.e., CH$_3$NH$_3$PbCl$_3$ film, was exposed to HI gas, only XRD peaks corresponding to CH$_3$NH$_3$PbI$_3$ were observed. Furthermore, mixed-perovskite halides were generated based on the present method by re-converting the ~33% PbO$_{x+y}$H$_{2y}$ formed by the MA gas exposure step 108 by exposing to HI or HBr gas. For example, a PbBr$_2$ film initially exposed to MA gas was subsequently exposed to HI gas in a stepwise manner, inducing the gradual formation of CH$_3$NH$_3$PbBr$_{3-x}$I$_x$ perovskite. UV-visible absorption spectra of the present films show the gradual band-gap tuning of the CH$_3$NH$_3$PbBr$_{3-x}$I$_x$ perovskite film as the HI exposure proceeds in the stepwise manner. Long exposure times caused the optical absorption edge to saturate at 690 nm. This saturation can be attributed to the formation of CH$_3$NH$_3$PbBr$_2$I perovskite, where iodine substituted all of the 33% PbO$_{x+y}$H$_{2y}$ formed during the MA gas exposure step 108. The XRD data for the mixed Br and I perovskite showed a shift in the peak position, indicating that Br- and I-based perovskites are mixed rather than segregated. This suggests that HI gas permeates easily into the bulk of the film, generating uniformly mixed Br and I perovskite. In contrast, the CH$_3$NH$_3$PbCl$_3$ film with PbO$_{x+y}$H$_{2y}$ exposed briefly to HBr led to the appearance of two XRD peaks at 15° and 15.6°, which could be assigned to the two segregated phases of CH$_3$NH$_3$PbBr$_3$ and CH$_3$NH$_3$PbCl$_3$ perovskites, respectively. In the case of SnBr$_2$, the conversion was not possible in air because the formation of SnO and CH$_3$NH$_3$Br was more favorable. When the MA gas exposure step 108 was performed in a N$_2$ glovebox followed by HI gas exposure, the conversion to CH$_3$NH$_3$SnBr$_x$I$_{3-x}$ perovskite was successful, although a certain amount of SnI$_2$ was also generated.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A method of forming a perovskite film, comprising:
   inducing a chemical reaction between a metal halide compound and methylamine (CH$_3$NH$_2$) gas by exposing the metal halide compound to a heated methylamine (CH$_3$NH$_2$) solution.

2. The method of claim 1, wherein the inducing of the chemical reaction between the metal halide compound and the methylamine (CH$_3$NH$_2$) gas comprises:
   forming a metal halide film comprising the metal halide compound on a substrate; and
   exposing the metal halide film to the methylamine (CH$_3$NH$_2$) gas for inducing the chemical reaction between the metal halide compound and the methylamine (CH$_3$NH$_2$) gas to form a first perovskite film.

3. A solar cell comprising a perovskite film as an active layer, the perovskite film fabricated by using the method of claim 1, wherein
   power conversion efficiency of the solar cell is greater than 7%.

4. The method of claim 2, wherein the exposing of the metal halide film to the methylamine (CH$_3$NH$_2$) gas comprises:
   attaching the substrate with a spin-coated metal halide compound on an internal bottom surface of a first container;

placing a second container containing the methylamine (CH$_3$NH$_2$) solution on a heated plate to generate the methylamine (CH$_3$NH$_2$) gas; and placing the first container including the substrate with the spin-coated metal halide compound attached on the internal bottom surface thereof to cover the second container containing the methylamine (CH$_3$NH$_2$) solution placed on the heated plate, by orienting a substrate surface having the spin-coated metal halide compound to face an opening of the second container.

5. The method of claim 2, further comprising:
exposing the first perovskite film to hydriodic acid (HI) gas to form a second perovskite film.

6. The method of claim 2, further comprising:
exposing the first perovskite film to hydriodic acid (HI) gas and methylamine (CH$_3$NH$_2$) gas sequentially for one or more cycles to form a third perovskite film.

7. The method of claim 2, further comprising:
exposing the first perovskite film to hydriodic acid (HI) gas and methylamine (CH$_3$NH$_2$) gas simultaneously to form a fourth perovskite film.

8. The method of claim 2, wherein
a size of the substrate is 10×10 cm$^2$ or larger.

9. The method of claim 2, further comprising: exposing the first perovskite film to hydriodic acid (HI) gas, wherein the exposing the first perovskite film to the hydriodic acid (HI) gas comprises:
placing the first perovskite film on a heated plate;
covering the first perovskite film on the heated plate with a third container; and
placing a fourth container containing a HI solution inside the third container and in the proximity of the first perovskite film.

10. A perovskite film fabricated by using the method of claim 2, the perovskite film comprising:
stoichiometric CH$_3$NH$_3$PbI$_3$ perovskite, wherein the perovskite has a mirror-like semi-transparent appearance with a RMS surface roughness of about 2 nm and grain sizes in the range of 40-70 nm.

11. The method of claim 5, wherein
the metal halide compound is PbI$_2$, and
the exposing the first perovskite film to hydriodic acid (HI) gas is configured to induce a conversion of PbO$_{x+y}$H$_{2y}$ included in the first perovskite film to PbI$_2$.

12. The method of claim 6, wherein
the metal halide compound is PbI$_2$,
the exposing the first perovskite film to hydriodic acid (HI) gas and methylamine (CH$_3$NH$_2$) gas sequentially is configured to induce a conversion of PbO$_{x+y}$H$_{2y}$ included in the first perovskite film to PbI$_2$, and sequentially to induce a chemical reaction between PbI$_2$ and the methylamine (CH$_3$NH$_2$) gas.

13. The method of claim 7, wherein
the metal halide compound is PbI$_2$,
the exposing the first perovskite film to hydriodic acid (HI) gas and methylamine (CH$_3$NH$_2$) gas simultaneously is configured to induce a conversion of PbO$_{x+y}$H$_{2y}$ included in the first perovskite film to PbI$_2$, and simultaneously to induce a chemical reaction between PbI$_2$ and the methylamine (CH$_3$NH$_2$) gas.

14. A perovskite film fabricated by using a method comprising: forming a PbI$_2$ film on a substrate; exposing the PbI$_2$ film to methylamine (CH$_3$NH$_2$) gas for inducing a chemical reaction between PbI$_2$ and methylamine (CH$_3$NH$_2$) gas to form a first perovskite film; and exposing the first perovskite film to hydriodic acid (HI) gas and methylamine (CH$_3$NH$_2$) gas sequentially for one or more cycles to form the perovskite film, the perovskite film comprising:
a reduced amount of PbO$_{x+y}$H$_{2y}$ compared to the first perovskite, based on a conversion of PbO$_{x+y}$H$_{2y}$ included in the first perovskite film to PbI$_2$, and sequentially a chemical reaction between PbI$_2$ and the methylamine (CH$_3$NH$_2$) gas, wherein the perovskite film has a RMS surface roughness of about 14 nm and grain sizes of about 400 nm.

15. A perovskite film fabricated by using a method comprising: forming a PbI$_2$ film on a substrate; exposing the PbI$_2$ film to methylamine (CH$_3$NH$_2$) gas for inducing a chemical reaction between PbI$_2$ and methylamine (CH$_3$NH$_2$) gas to form a first perovskite film; and exposing the first perovskite film to hydriodic acid (HI) gas and methylamine (CH$_3$NH$_2$) gas simultaneously to form the perovskite film, the perovskite film comprising:
a reduced amount of PbO$_{x+y}$H$_{2y}$ compared to the first perovskite, based on a conversion of PbO$_{x+y}$H$_{2y}$ included in the first perovskite film to PbI$_2$, and simultaneously a chemical reaction between PbI$_2$ and the methylamine (CH$_3$NH$_2$) gas, wherein the perovskite film has a RMS surface roughness of about 6 nm and grain sizes of about 200 nm.

\* \* \* \* \*